United States Patent
Gesche et al.

[11] Patent Number: 5,538,610
[45] Date of Patent: Jul. 23, 1996

[54] VACUUM COATING SYSTEM

[75] Inventors: Roland Gesche, Seligenstadt; Karl Keim, Büdingen; Helmut Rauner, Nidderau; Günter Wurpts, Mespelbrunn, all of Germany

[73] Assignee: Leybold Aktiengesellschaft, Hanau, Germany

[21] Appl. No.: 459,777

[22] Filed: Jun. 2, 1995

[30] Foreign Application Priority Data

Aug. 9, 1994 [DE] Germany ............ 44 28 136.6

[51] Int. Cl.⁶ .................................................. C23C 14/34
[52] U.S. Cl. ................. 204/298.15; 204/298.25; 204/298.34; 204/298.35
[58] Field of Search ............. 204/298.15, 298.23, 204/298.25, 298.34, 298.35, 192.32

[56] References Cited

U.S. PATENT DOCUMENTS

| | | | |
|---|---|---|---|
| 3,787,312 | 1/1974 | Wagner et al. | 204/298.23 X |
| 4,194,962 | 3/1980 | Chambers et al. | 204/298.23 |
| 4,593,644 | 2/1986 | Hanak | 118/719 |
| 5,133,285 | 10/1992 | Mahler et al. | 118/719 |
| 5,244,554 | 9/1993 | Yamagata et al. | 204/298.35 X |
| 5,244,559 | 9/1993 | Latz | 204/298.15 X |

FOREIGN PATENT DOCUMENTS

| | | |
|---|---|---|
| 1319691 | 4/1990 | Japan . |
| 1298182 | 8/1990 | Japan . |
| 379759 | 2/1991 | Japan . |

*Primary Examiner*—Nam Nguyen
*Attorney, Agent, or Firm*—Felfe & Lynch

[57] ABSTRACT

A vacuum coating system has a processing station (2) designed as a sputter-etching station, in which a high-frequency input electrode (25) is mounted between two substrate holders (23, 24), which carry the substrates (5, 6). Between the substrate holders (23, 24) and the high-frequency input electrode (25), a distance (a) is provided, which is smaller than the dark space distance.

8 Claims, 3 Drawing Sheets

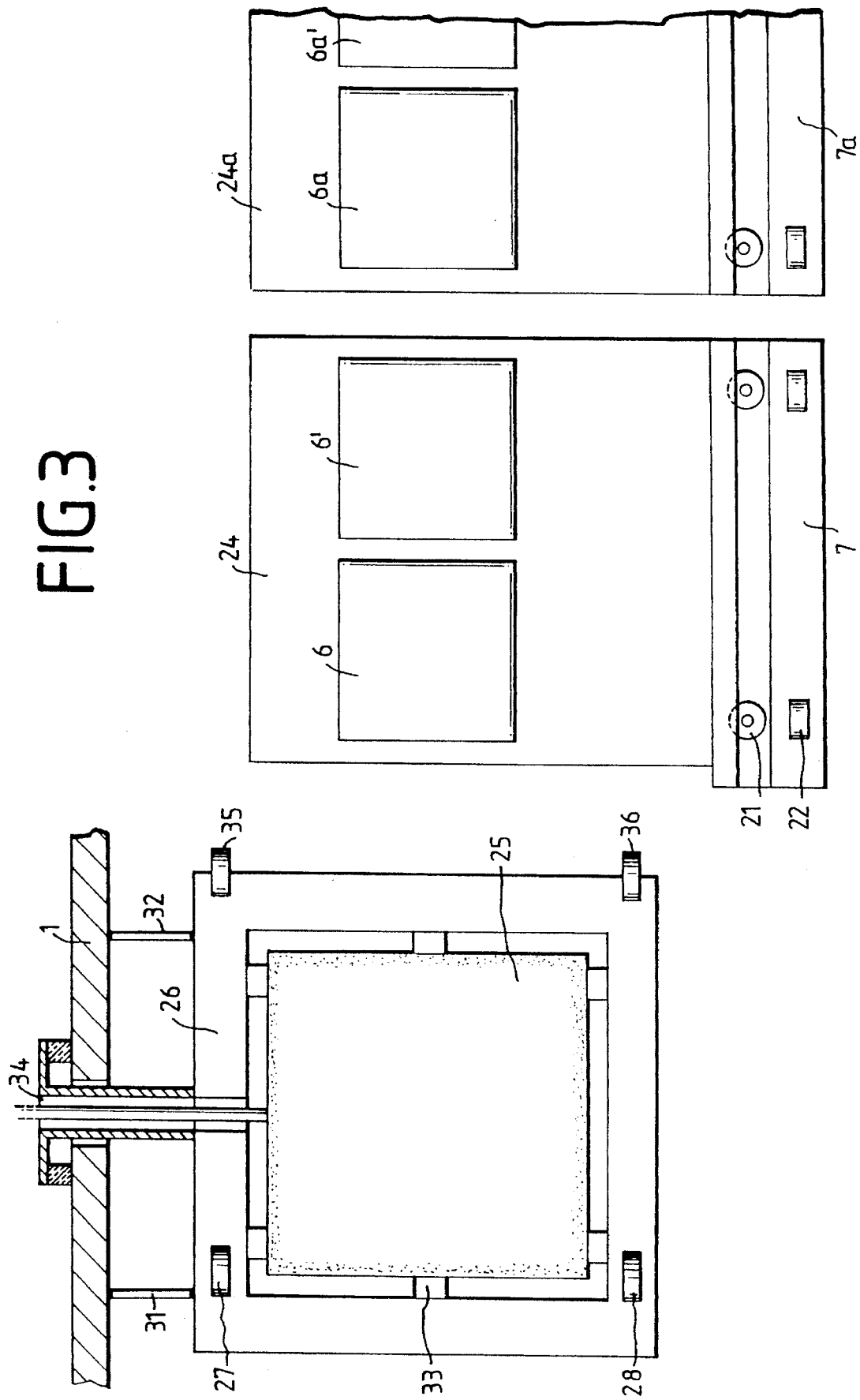

VACUUM COATING SYSTEM

BACKGROUND OF THE INVENTION

The invention pertains to a vacuum coating system with a housing in which several processing stations are provided, at least one of which is equipped with a sputter cathode, the system also being provided with transport carts, each carrying at least one substrate holder in or parallel to the coating plane into which at least one substrate can be inserted, and which, in the area of the substrate, has an opening which exposes the area to be coated.

Vacuum coating systems of the type described above are known as in-line sputtering systems and are used in particular for the coating of glasses with indium-tin oxide (ITO), $SiO_2$, or $Ta_2O_5$ for display technology.

In known vacuum coating systems of a different design, sputter-etching is used to clean the substrates. In this case, it is not the cathode with the target but rather the electrically nonconductive substrate which is exposed to high-frequency energy. A plasma is thus formed at the substrate, and this plasma removes oxide layers and impurities from the surface. In the case of electrically conductive substrates, the substrate material is treated with high-frequency energy by applying the high frequency to the substrate holder, which is designed as an open frame. When the substrates are not electrically conductive, however, the substrate holders must have a closed surface behind the substrates, because otherwise no etching action would be achievable on the nonconductive substrates.

A closed surface of this type, however, cannot be realized when a substrate heater must be installed behind the substrates. A heater is advantageous, for example, when glasses are to be coated with indium-tin oxide by sputtering. This creates the dilemma that, for the process of sputter etching, the area behind the substrates must be closed, but for the process of heating the substrate during sputtering, this area must remain open.

SUMMARY OF THE INVENTION

The invention is based on the problem of designing a vacuum coating system of the type described above in such a way that high frequency can be applied to substrates to carry out a sputter-etching process without as a result excluding the possibility of heating the substrate from the side opposite the sputter cathode.

According to the invention, to create a sputter-etching station, a plate-shaped high-frequency input electrode is installed in a permanent manner on one side opposite an anode plate, this electrode being electrically insulated with respect to the housing. The distance separating the electrode from the substrate, which is brought up in front of the electrode by the transport cart, is so small that no plasma can form between the high-frequency input electrode and the substrate holder.

In a vacuum coating system of this type, the substrate holder can have an opening passing all the way through it, because the high-frequency energy applied during sputter-etching is introduced capacitatively into the substrate. The key point here is that the distance between the high-frequency input electrode and the substrate holder must be smaller than the dark space distance. This prevents plasma from being formed, which would have the effect of reversing the etching process, in which case material would be removed from the high-frequency input electrode and deposited on the substrate.

The short distance between the substrate holder and the high-frequency input electrode leads not only to the advantage that it is possible to heat the substrate from the rear in the sputter coating station but also to the advantage that the substrate holders or the substrates do not have to touch the high-frequency input electrode. As a result, there is no longer any need to provide means for moving the substrate holders crosswise to the direction of travel of the transport carts. This means that the vacuum coating system can be of simple design, and there is no increase in the danger that particles will be formed as a result of abrasion. It must be kept in mind here that a mechanism for moving the substrates in the transverse direction would have to run dry in the high vacuum of the system and would also have to withstand temperatures of up to 400° C. A great deal of effort would be required to achieve this, and even so it would never be possible to prevent completely the formation of particles. Because the substrate holders are held in a vertical position, furthermore, it now becomes possible for all the drive equipment to be installed underneath the substrates, which also helps reduce the danger of contamination of the substrates with particles.

To increase the output of the vacuum coating system according to the invention, it is possible, in accordance with an advantageous embodiment of the invention comparable to that of in-line systems not having the possibility of sputter-etching, to provide the transport cart with two substrate holders parallel to each other in the direction of motion of the transport cart, the distance between the holders being calculated in such a way that the substrate holders can be brought up to and around both sides of the high-frequency input electrode at a distance capable of preventing the formation of plasma.

An especially simple piece of equipment is obtained when, the transport carts are designed to stop at a position in which the substrates in the two respective substrate holders are opposite the high-frequency input electrode. Static sputter-etching can be accomplished in this vacuum coating system.

For dynamic sputtering, the transport carts can be designed to travel past the high-frequency input electrode at a uniform rate of speed, each substrate holder being provided with a cover, which extends over the gaps between it and the adjacent substrate holders.

An extremely simple method of installing the high-frequency input electrode in the system is to mount it inside a frame, which surrounds the edges of the electrode. To hold the high-frequency input electrode in place, insulators are provided between the electrode and the inside edges of the frame facing it. It is easy to prevent the distance between the high-frequency input electrode and the substrate holders from being too small by installing guard rollers, which turn around axes parallel to the plane of the substrate holders. As the substrate holders pass by the high-frequency input electrode, they rest on these rollers.

In the case of static sputter-etching, it would be possible to prevent the distance between the high-frequency input electrode and the substrate holders from becoming too large by clamping the substrate holders against the guard rollers in the sputter-etching station. Too great a distance can be very easily prevented by ensuring that the distance between the substrate holders is slightly smaller than the maximum distance in the transverse direction between the outermost areas of the guard rollers.

If the high-frequency input electrode is designed to be suspended from the housing, a system with an especially simple design is obtained.

BRIEF DESCRIPTION OF THE DRAWING

FIG. 3 shows a view from the side into the interior of the vacuum coating system in the area of the sputter-etching station.

DETAILED DESCRIPTION OF THE PREFERRED EMBODIMENT

Figure 1:
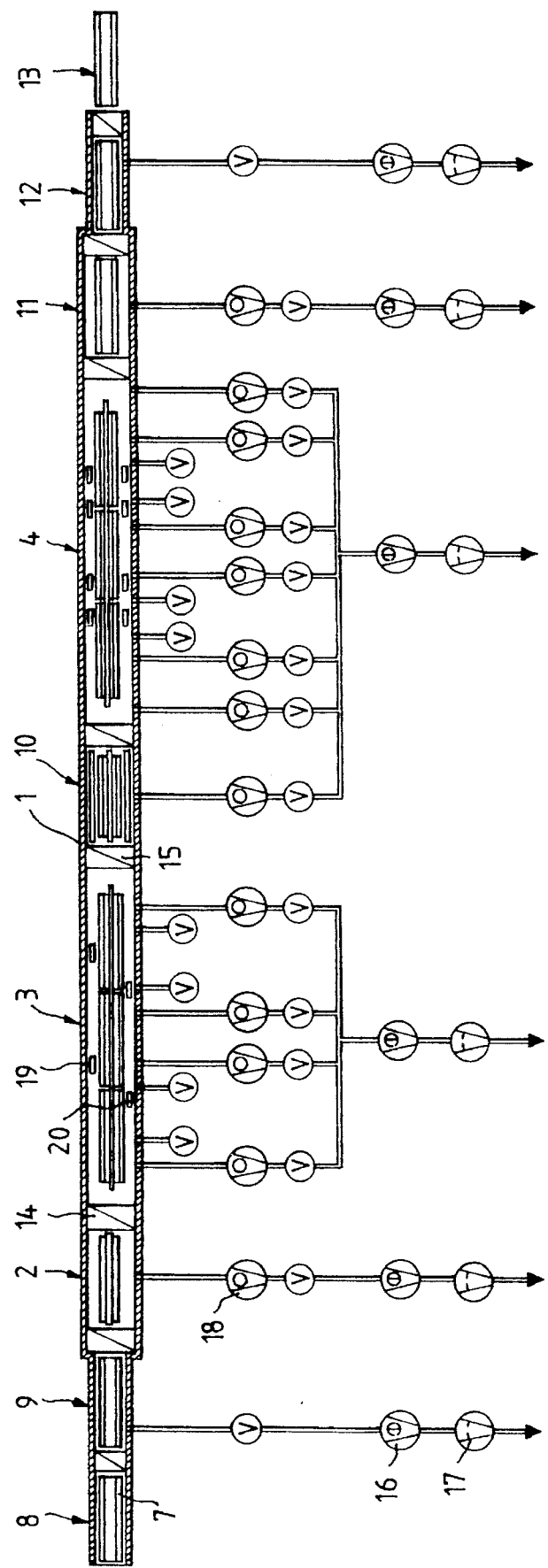
FIG. 1 shows a schematic diagram of a vacuum coating system according to the invention.

The vacuum coating system shown schematically as a whole in FIG. 1 has several processing stations 2, 3, 4 in a row inside a housing 1. Processing station 2 is a sputter-etching station, whereas processing stations 3, 4 are sputtering chambers, in which sputter cathodes 19, 20 are installed on both sides of transport carts 7. Transport carts 7 are used to hold and transport substrates 5, 6 to be coated, shown in FIG. 2. These are loaded with substrates 5, 6 in a loading station 8 and then travel one after the other into an inward-transfer module 9 and thence to the individual processing stations 2, 3, 4. Between processing stations 3, 4 there is a buffer station 10, and behind processing station 4 there are two outward-transfer modules 11, 12, and an unloading station 13. The individual stations and modules are separated from each other by locks, such as locks 14, 15 of processing station 3.

The pumps required for evacuation are also shown in FIG. 1. Whereas inward-transfer module 9 and outward-transfer module 12 are provided only by way of example with a Roots pump 16 and a Trivac pump 17, processing stations 2, 3, 4, buffer station 10, and first outward-transfer module 11 also have a high-vacuum pump 18, such as a turbomolecular pump.

Figure 2:
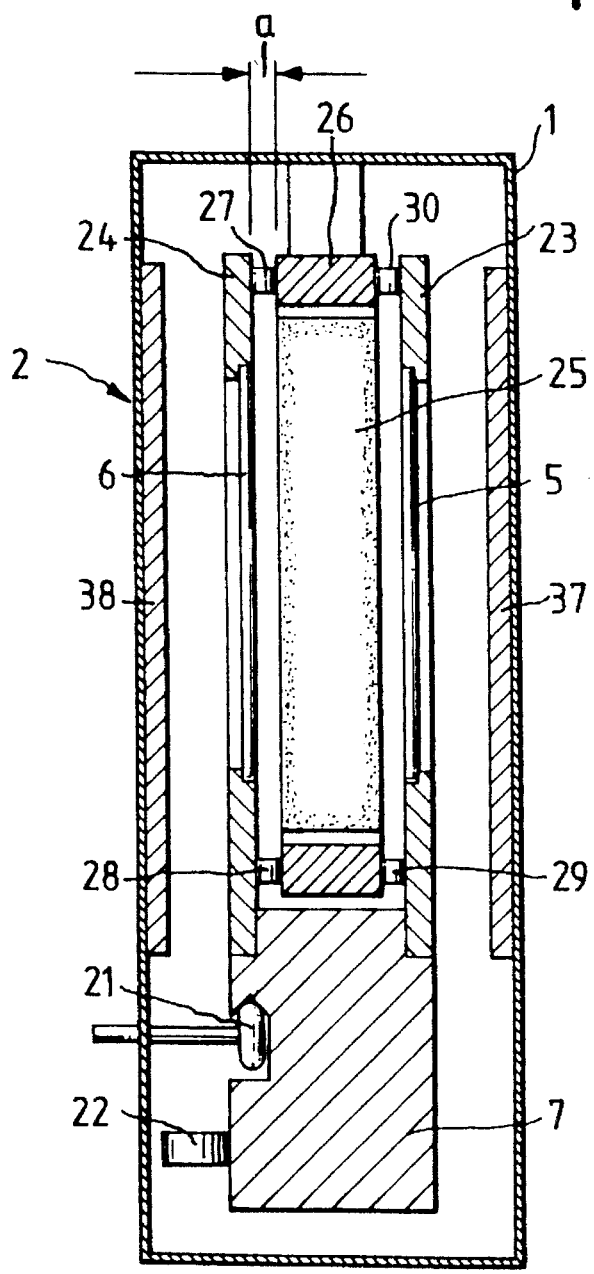
FIG. 2 shows a cross section through the vacuum coating system.

On a much larger scale than FIG. 1, FIG. 2 shows a transport cart 7, which is moved by means of driven rollers 21, 22, in housing 1. This transport cart 7 has, on each of its long sides, a substrate holder 23, 24, designed as frames, into which substrates 5, 6 can be inserted from the inside. Transport cart 7 with substrate holders 23, 24 and also housing 1 are grounded. To load and unload substrate holders 23, 24, they are flipped outward around their lower edge, so that substrates 5, 6 can be inserted or removed from above.

There is enough room between substrate holders 23, 24 that they can be driven up to and around a plate-shaped high-frequency input electrode 25, leaving a small distance a on both sides. High-frequency input electrode 25 is enclosed along its narrow sides by a frame 26, serving as a dark space shield, from which guard rollers 27, 28, 29, 30 project, these rollers rotating around vertical axes. Substrate holders 23, 24 rest against these rollers so that the distance between the holders and the electrode can never be less than a. Distance a is smaller than the dark space distance. For this reason, no plasma can form between substrate 6 and high-frequency input electrode 25 or on the other side between high-frequency input electrode 25 and substrate 5. On the sides of each substrate holder 23, 24 facing away from high frequency input electrode 5 there is an anode plate 37, 38, which is also grounded, like housing 1.

FIG. 3 shows that frame 26 is attached by means of supports 31, 32 to the roof of housing 1. Around its inside edges, frame 26 has several insulators 33, which keep high-frequency input electrode 25 electrically insulated. A pass-through 34 is provided for high-frequency input electrode 25 in the conventional manner so that high-frequency energy can be supplied to the electrode from the outside. Guard rollers 27, 28 and two additional guard rollers 35, 36 can also be seen in frame 26.

On the right, next to frame 26, it is possible to see two transport carts 7, 7a, and, on each one, a substrate holder 24, 24a with two substrates 6, 6'; 6a, 6a'.

Figure 4:
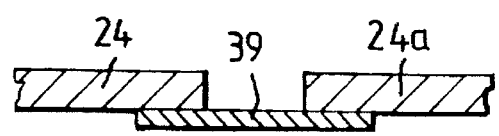
FIG. 4 shows an area between two substrate holders.

For sputter-etching in the normal case, cart 7 will be made to stop underneath high-frequency input electrode 25 for the sputter-etching process. In principle, however, it is also possible to carry out sputter-etching dynamically. In this case, no open gap between substrate holders 24, 24a of successive transport carts 7, 7a may arrive in front of high-frequency input electrode 25, because otherwise, instead of impurities being removed from substrates 5, 6, material would be removed from high-frequency input electrode 25. As FIG. 4 shows, such gaps can be avoided by the use of a cover 39, which is attached to each substrate holder 24 and extends all the way over to substrate holder 24a following along next in line.

We claim:

1. Vacuum coating system with a housing in which several processing stations are provided, at least one of these stations being equipped with a sputter cathode, the system also having transport carts, each carrying at least one substrate holder on or parallel to the plane of motion, into which at least one substrate can be inserted and which, in the area of the substrate, has an opening exposing the area to be coated, wherein a plate-shaped high-frequency input electrode (25) is permanently installed on one side opposite an anode plate (37, 38) to create a sputter-etching station, this electrode being electrically insulated with respect to the housing (1), where the distance (a) separating the electrode from the substrate (5, 6), which is brought up in front of the electrode by the transport cart (7), is so small that no plasma can form between the high-frequency input electrode (25) and the substrate holder (23, 24).

2. Vacuum coating system according to claim 1 wherein the transport cart (7) has two substrate carriers (23, 24), arranged parallel to each other in the direction of travel of the transport cart (7), the distance between the carriers being calculated so that the substrate carriers (23, 24) can be moved up to and around both sides of the high-frequency input electrode (25) at the distance (a) which excludes the possibility of plasma formation.

3. Vacuum coating system according to claim 1 wherein the transport carts (7) are designed to stop in the position where the substrates (5, 6) in the two respective substrate holders (23, 24) are opposite the high-frequency input electrode (25).

4. Vacuum coating system according to claim 1 wherein the transport carts (7) are designed to travel at a uniform rate of speed past the high-frequency input electrode (25), and in that each substrate holder (23, 24) has a cover (39), which extends over the gap between adjacent substrate holders (24a).

5. Vacuum coating system according to claim 1 wherein high-frequency input electrode (25) is mounted inside a frame (26), which extends around the edges of the electrode, insulators (33) being provided between the high-frequency input electrode (25) and the facing inside edges of the frame (26) to hold the high-frequency input electrode (25) in place.

6. Vacuum coating system according to claim 1 further comprising guard rollers provided in said frame, said guard rollers being rotatable around axes parallel to the plane of the substrate holders (23, 34), the substrate holders (23, 24) resting against said guard rollers as they pass in front of the high-frequency input electrode (25).

7. Vacuum coating system according to claim 1 wherein the distance between the substrate holders (23, 24) is slightly smaller than the maximum distance in the transverse direction between the outermost areas of the guard rollers.

8. Vacuum coating system according to claim 1 wherein the high-frequency input electrode (25) is suspended in the housing (1).

* * * * *